United States Patent
Kushihara

[11] Patent Number: 5,815,424
[45] Date of Patent: Sep. 29, 1998

[54] DIGITAL ANGLE CONVERSION METHOD

[75] Inventor: Hiroshi Kushihara, Nagano-ken, Japan

[73] Assignee: Tamagawa Seiki Kabushiki Kaisha, Nagano-ken, Japan

[21] Appl. No.: 988,134

[22] Filed: Dec. 10, 1997

[30] Foreign Application Priority Data

Sep. 11, 1997 [JP] Japan ................................. 9-246915

[51] Int. Cl.$^6$ .............................................. G06G 7/22
[52] U.S. Cl. ............................................... 364/817
[58] Field of Search .................... 364/817, 807, 364/602

[56] References Cited

U.S. PATENT DOCUMENTS

| | | | |
|---|---|---|---|
| 4,149,260 | 4/1979 | Loper, Jr. ............................. | 364/817 |
| 4,335,443 | 6/1982 | Dickey .................................. | 364/817 |

*Primary Examiner*—Tan V. Mai
*Attorney, Agent, or Firm*—Sughrue, Mion, Zinn, Macpeak & Seas, PLLC

[57] ABSTRACT

In a conventional digital angle conversion method, constituent parts partially have an analog arrangement, the entire arrangement is not easily made as a monolithic semiconductor, and a low price, a light weight, and high reliability cannot be easily obtained. In addition, high-speed tracking is limited. A digital angle conversion method according to the present invention is a method in which a rotating signal is introduced into a sin·cos multiplier (2) to obtain a first output signal $\sin(\theta-\phi)\cdot f(t)$, the first output signal $\sin(\theta-\phi)\cdot f(t)$ is synchronously rectified to remove an exciting component $f(t)$ so as to obtain a second output signal $\sin(\theta-\phi)$, a digital angle output ($\phi$) is obtained by a voltage control oscillator (5) and a one-turn counter (6), and the arrangement of respective sections can be made as a monolithic semiconductor.

4 Claims, 13 Drawing Sheets

FIG. 1 PRIOR ART $\theta$ : RESOLVER TURN ANGLE
$\phi$ : OUTPUT COUNTER VALUE
VCO : VOLTAGE CONTRALLED OSCILLATOR
LOOP IS ARRANGED TO SATISFY $\theta - \phi = 0$ (TRACKING METHOD R/D CONVERTER)

RESOLVER EQUIVALENT CIRCUIT

EXCITING COMPONENT PHASE SYNCHRONIZATION
PHASE SELECTION LOGIC

FIG. 6

FIG. 7 sin φ CHARACTERISTIC        cos φ CHARACTERISTIC

FIG. 8

▷ SIGNAL SELECTION LOGIC
OF SIN, COS MULTIPLIER SECTION

| INPUT SIGNAL | φ | | | |
|---|---|---|---|---|
| | 0°~90° | 90°~180° | 180°~270° | 270°~360° |
| $\sin\theta \cdot f_{(t)}$ | $\cos\phi$ | — | — | $\sin\phi$ |
| $-\sin\theta \cdot f_{(t)}$ | — | $\sin\phi$ | $\cos\phi$ | — |
| $\cos\theta \cdot f_{(t)}$ | $\sin\phi$ | $\cos\phi$ | — | — |
| $-\cos\theta \cdot f_{(t)}$ | — | — | $\sin\phi$ | $\cos\phi$ |

VCO OPERATION WAVEFORM

FIG. 15

FIG. 16 n=10 or 14
(DEPEDING ON SET RESOLUTION)

FIG. 17

DIGITAL ANGLE CONVERSION METHOD

BACKGROUND OF THE INVENTION

1. Field of the Invention

The present invention relates to a digital angle conversion method and, more particularly, to novel improvement of conversion of a tracking method for making respective circuit arrangements as a monolithic semiconductor and achieving a low price, a small size, a light weight, high reliability, and high-speed tracking.

2. Description of the Related Art

Figure 1:
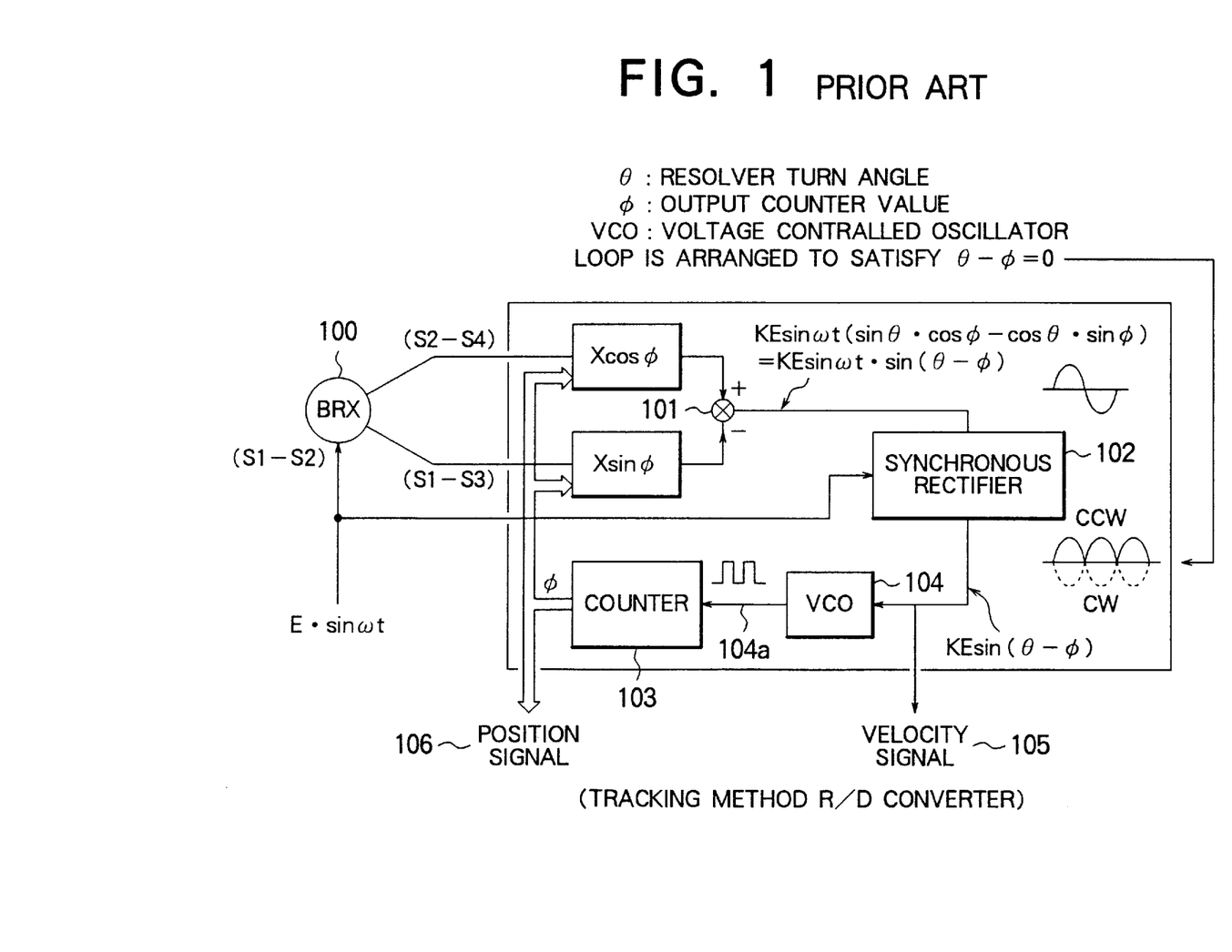
FIG. 1 is a view showing a block diagram of conventional tracking method R/D conversion.

As a conventionally used digital angle conversion method of this type, for example, a tracking method shown in FIG. 1 is popularly used. More specifically, reference numeral 100 in FIG. 1 denotes a resolver excited by an exciting signal E·sinωt. Two-phase outputs KEsinθsinωt and KEcosθsinωt obtained from the resolver 100 are arithmetically operated by an arithmetic operator 101. The output signal KEsinωt·sin(θ−φ) (where θ: resolver rotating angle, and φ: output counter value) is synchronously rectified by a synchronous rectifier 102 to which the exciting signal E·sinωt is input.

The output signal KEsin(θ−φ) obtained by the synchronous rectifier 102 is input to a counter 103 as a pulse output 104a through a voltage controlled oscillator 104 to obtain an output counter value φ serving as a digital angle output from the counter 103.

The output counter value φ is fed back to form a feedback loop. Therefore, when a velocity signal 105 is obtained by the output signal KEsin(θ−φ) from the synchronous rectifier 102, and a position signal 106 can be obtained by the output counter value φ from the counter 103.

Since the conventional digital angle conversion method is arranged as described above, the digital analog conversion method has the following problem.

More specifically, in the above block diagram, since partially constituted by a complex analog block diagram, the block diagram cannot be made as a monolithic semiconductor as a whole, a low price, a small size, a light weight, high reliability, and utility cannot be easily achieved. In addition, a preferable means for improving a tracking speed cannot be found.

SUMMARY OF THE INVENTION

The present invention has been made to solve the above problem and, more particularly, has as its object to provide a digital angle conversion method which makes respective circuit arrangements as a monolithic semiconductor, achieves a low price, a small size, a light weight, and high reliability, and makes it possible to obtain high-speed tracking.

According to the present invention, there is provided a digital angle conversion method in which a digital angle output (φ) is obtained from a rotating signal (sinθ·f(t), cosφ·f(t), where f(t): an exciting component) obtained by a rotating detector, wherein the rotating signal (sinθ·f(t), cosφ·f(t)) is introduced into a sin-cos multiplier and mutually operated with sinφ and cosφ obtained from the digital angle output (φ) to obtain a first output signal (sin(θ−φ)·f(t)) as the result of sinθ·f(t)×cosφ−cosθ·f(t)×sinφ=sin (θ−φ)·f(t), the first output signal (sin(θ−φ)·f(t)) is synchronously rectified by a synchronous detector to remove the exciting component f(t) so as to obtain a second output signal (sin(θ−φ)), the second output signal (sin(θ−φ)) passes through an integrator and a voltage control oscillator to obtain the digital angle output (φ) from a one-turn counter, the digital angle output (φ) is input to the sin·cos multiplier and a synchronous phase detector to perform feedback control, control deviation ε=sin(θ−φ) this feedback control is set to zero to satisfy θ=φ. In the method, a triangular wave obtained from a triangular wave oscillation circuit is used as an exciting component f(t). In the method, the digital angle output (φ) is caused to pass through an encoder pulse generation logic section to obtain encoder signals (A, B, Z, U, V, and W). In the method, an output from the one-turn counter is input to a multi-turn counter to obtain multi-turn data (MT).

DESCRIPTION OF THE PREFERRED EMBODIMENT

A preferred embodiment of a digital angle conversion method according to the present invention will be described below with reference to the accompanying drawings.

Figure 2:
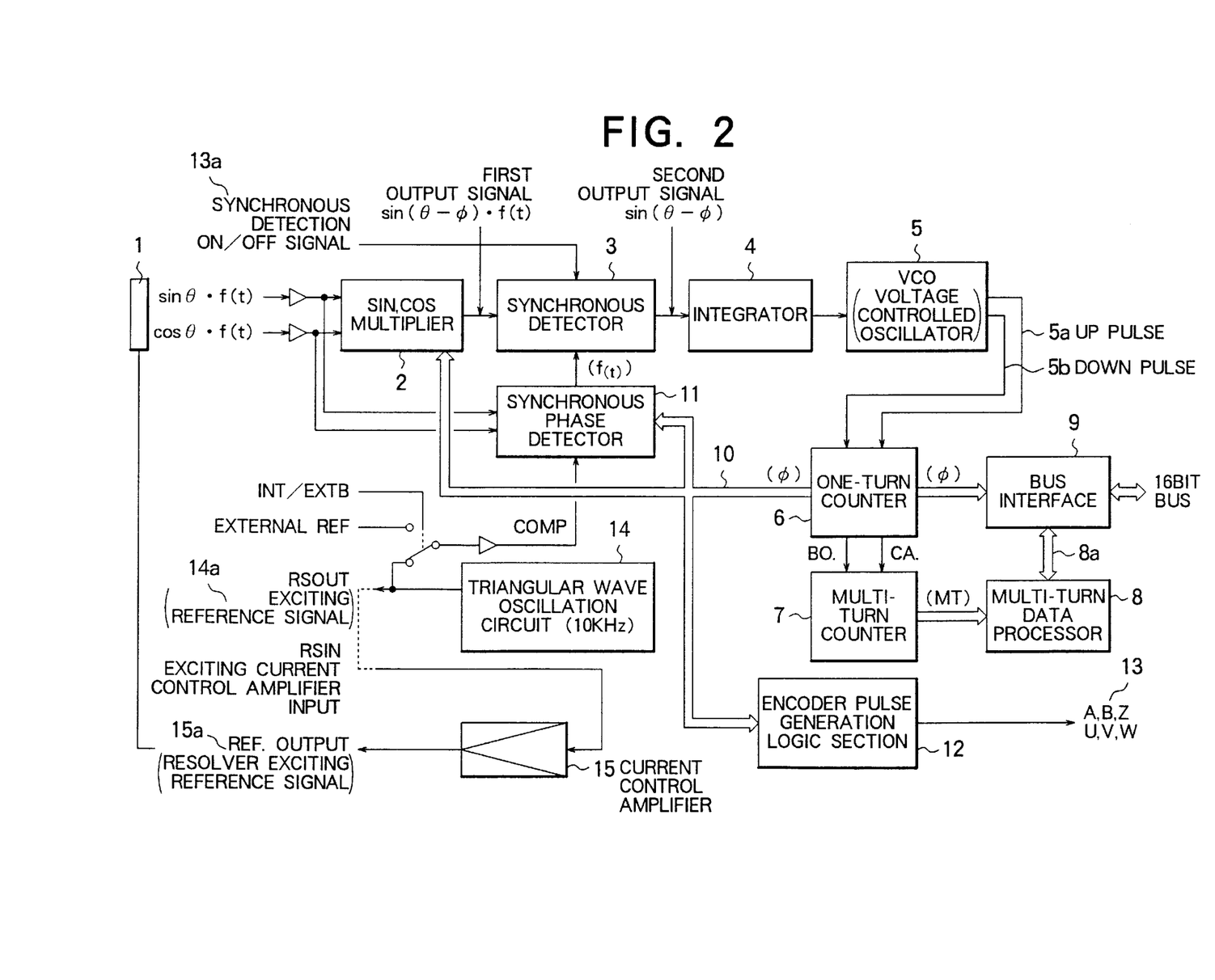
FIG. 2 is a block diagram showing a digital angle conversion method according to the present invention.

Referring to FIG. 2, reference numeral 1 denotes, e.g., a known one-phase excitation/two-phase output type resolver 1, two-phase rotating signals sinθ·f(t) and cosθ·f(t) including an exciting component f(t) output from the resolver 1 are input from a SIN·COS multiplier 2 to a synchronous detector 3 as a first output signal sin(θ−φ)·f(t), and a second output signal sin(θ−φ) from the synchronous detector 3 is input to a voltage controlled oscillator through an integrator 4.

An up pulse 5a and a down pulse 5b from the voltage controlled oscillator 5 are counted by a one-turn counter 6 as a CW direction or a CCW direction to output a digital angle output φ. A carry signal CA and a borrow signal BO from the one-turn counter 6 are input to a multi-turn counter 7, and a multi-turn signal MT from the multi-turn counter 7 is transmitted to an external circuit through a multi-turn data processor 8 and a bus interface 9 together with the digital angle output φ.

Figure 15:
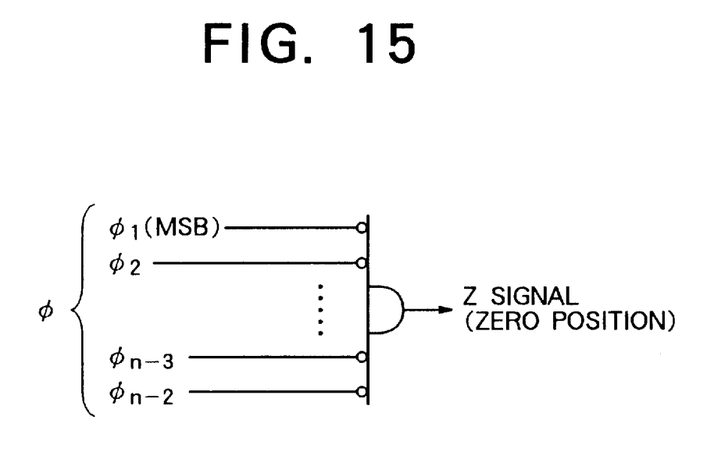
FIG. 15 is a view showing a circuit for generating a Z signal.
Figure 16:
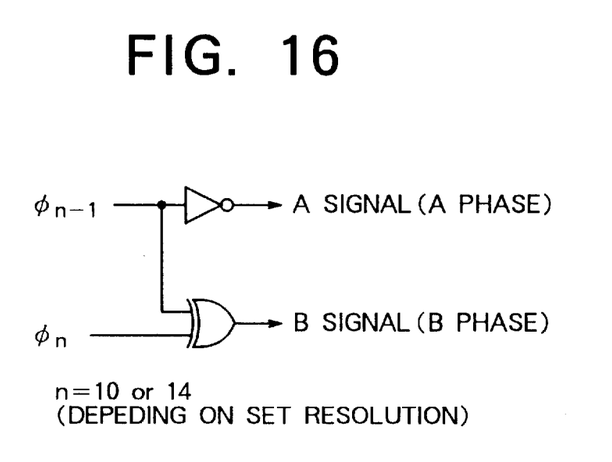
FIG. 16 is a view showing a circuit for generating A and B signals.
Figure 17:
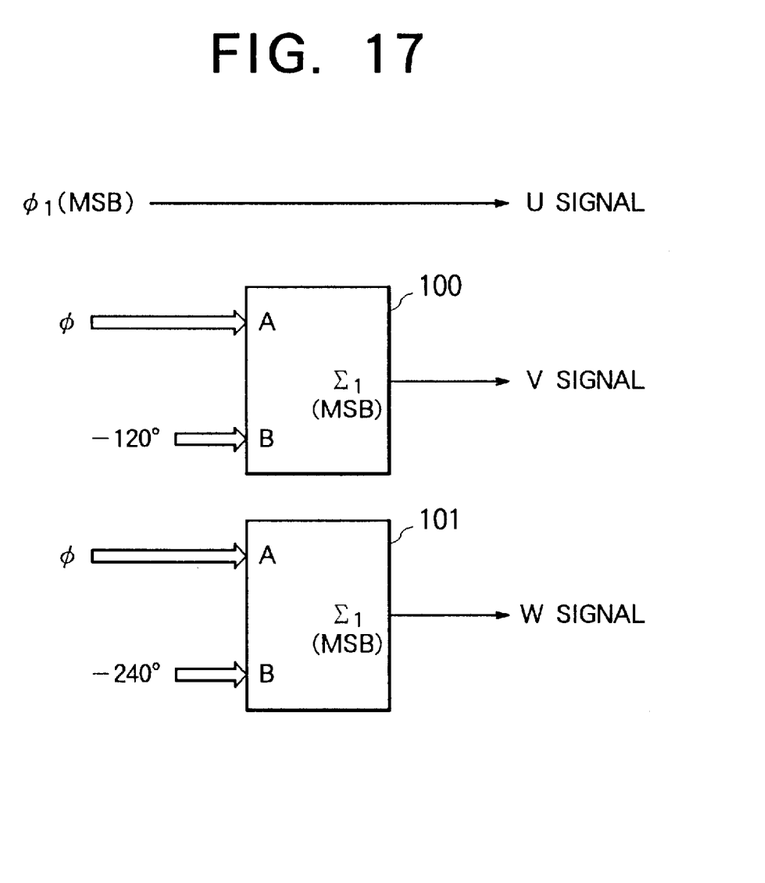
FIG. 17 is a view showing a block diagram for generating U, V, and W signals.

The digital angle output φ is input, through a path 10, to a synchronous phase detector 11, the SIN·COS multiplier 2, and an encoder pulse generation logic section 12 to which the rotating signals sinθ·f(t), cosθ·f(t) is input. A known tracking scheme using feedback is formed by the path 10, and an encoder signal 13 constituted by known A, B, Z, U, V, and W is output from the encoder pulse generation logic section 12. The encoder signal 13 is obtained in the following manner. That is, as well known, when A, B, and Z signals (A phase, B phase, and Z phase representing i.e., a zero position) are extracted by converting the digital angle output φ serving as an absolute digital (parallel) signal, as shown in FIG. 15, the Z signal is output by using LSB to MSB of the digital angle output φ, and, as shown in FIG. 16, $\phi_{n-1}$ and $\phi_n$ (n: 10 or 14 depending on a set resolution) of the digital angle output φ are used. In addition, U, V, and W signals serving as phase switching signals of a 3-phase motor are obtained in the following manner. That is, as shown in FIG. 17, $\phi_1$(MSB) is used as the U signal, and signals having angles of -120° and -240° with respect to the digital angle output φ are input to full-adder type adders 100 and 101 to obtain the V and W signals.

The synchronous detection ON/OFF signal 13a is input to the synchronous detector 3, and a known triangular wave oscillation circuit 14 for outputting an exciting reference signal 14a constituted by a triangular wave of, e.g., 10 kHz is arranged. The exciting reference signal 14a is input to a known current control amplifier 15, a resolver exciting power supply output 15a output depending on the level of the exciting reference signal 14a is applied to the resolver 1 as an exciting signal REF of the resolver 1.

An operation will be described below.

It is known that the one-phase excitation/two-phase output (amplitude modification) type resolver 1 is a stable sensor which does not depend on temperature drift, a transfer cable length, or the like. However, when an exciting component function of the resolver 1 is represented by f(t), the following two-phase sin wave signals is subjected to amplitude modulation by the angle θ are output from the resolver 1.

$$V_{s2\text{-}s4} = \sin\theta \cdot f(t)$$
$$V_{s1\text{-}s3} = \cos\theta \cdot f(t) \qquad \text{Equation (1)}$$

In these equations, $V_{s2\text{-}s4}$ and $V_{s1\text{-}s3}$ are outputs of both the ends of the known two-phase output coil (not shown) of the resolver 1. In this embodiment, since a current control scheme for a triangular wave (10 kHz) is employed to excite the resolver as described later, the function f(t) becomes a rectangular wave (10 kHz).

The rotating signals sinθ·f(t), cosθ·f(t) expressed by Equation (1) are introduced into the SIN·COS multiplier 2, and mutually operated with sinφ and cosφ obtained by the digital angle output φ, thereby obtaining the following signal.

$$\sin\theta \cdot f(t) \times \cos\phi - \cos\theta \cdot f(t) \times \sin\phi = \sin(\theta-\phi) \cdot f(t) \qquad \text{Equation (2)}$$

In this case, as sinφ and cosφ, to simplify the circuit, an approximate function expressed by Equation (3) of Number 1 described below is used.

[Number 1]

$$\sin\phi \approx \frac{(1+A) \cdot \phi}{1+A \cdot \phi} \qquad \text{Equation (3)}$$

$$\cos\phi \approx \frac{(1+A)(1-\phi)}{1+A \cdot (1-\phi)}$$

$$A \approx 0.56312$$

where 0≦φ<1 (range of 0° to 90°).

The signal is synchronously rectified by the synchronous detector 3 to cancel the exciting component f(t), and a feedback control loop (tracking loop) is developed to make a control deviation ε expressed in the following equation (4) zero.

$$\text{control deviation: } \epsilon = \sin(\theta - \phi) \qquad \text{Equation (4)}$$

$$\epsilon = 0 \therefore \theta = \phi \qquad \text{Equation (5)}$$

the digital angle output φ corresponding to a resolver signal input can be obtained from the one-turn counter 6.

The integrator 4 serving as a constituent element of a tracking loop corresponds to a compensator in a control theory for improving the stability and responsibility of a control system, and has transfer characteristics expressed by Equation (6) of Number 2 described below.

[Number 2]

$$Gi = \frac{1}{T} \cdot \frac{1 + T1 \cdot S}{S(1 + T2 \cdot S)} \qquad \text{Equation (6)}$$

(S: Laplace operator)

where

Gi: transfer function of the integrator,

T: integrator constant.

The VCO (voltage controlled oscillator 5) (to be described later), as well known, is means for converting an input voltage into a digital pulse, and the one-turn counter 6 is means for integrating (counting) an input pulse to convert the input pulse into a parallel digital angle signal φ.

Operations of respective sections in FIG. 2 will be described below.

A current control exciting scheme by a triangular wave obtained by the triangular wave oscillation circuit 14 and the current control amplifier 15.

In general, amplitude modulation type resolver excitation controls the voltage of a sin wave. However, in the present invention, a current of a triangular wave (10 kHz) is controlled in the following manners.

(1) Even if a short-circuit accident of an output occurs, only controlled current flows. For this reason, a secondary accident such as circuit burning does not occur.

(2) An input impedance of the resolver is basically an inductance component, and a resolver output is obtained by changing a change in current into a change in magnetic flux. For this reason, it is preferable to directly control a current.

(3) The electric power loss of an output circuit can be suppressed to be smaller than a voltage output.

(4) In general cable transfer, an excellent current mode is obtained.

(5) According to current control, an error of an output voltage phase with respect to input current phase in a single resolver does not basically occur.

Figure 3:
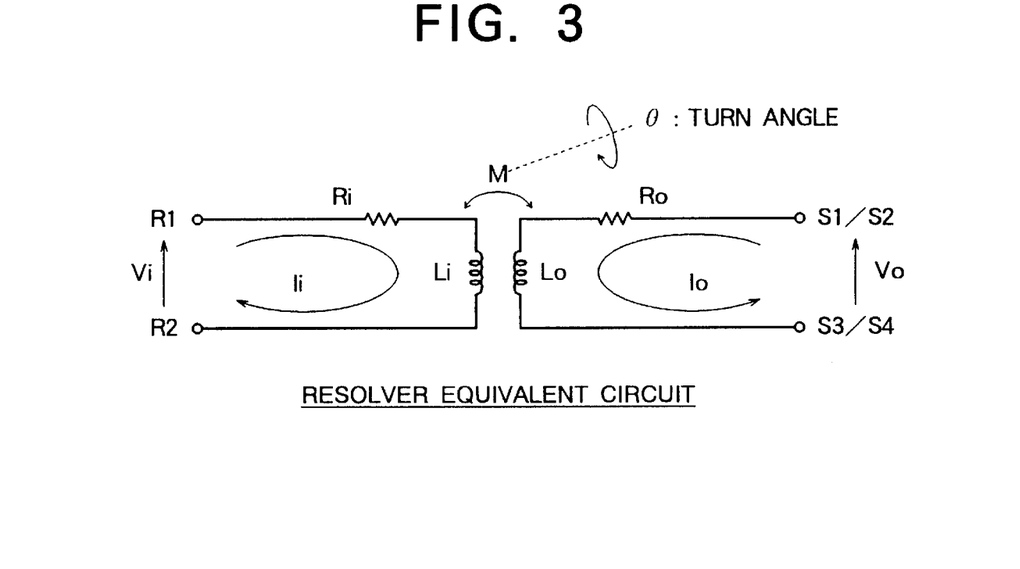
FIG. 3 shows an equivalent circuit of a resolver.
Figure 4:
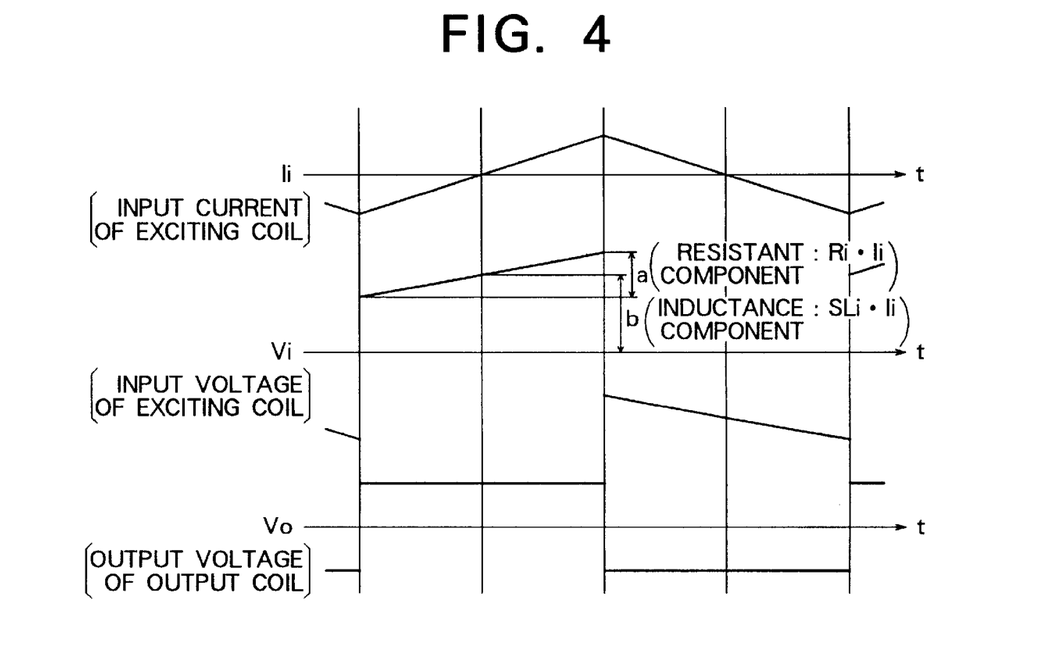
FIG. 4 is a waveform chart showing excitation and output states caused by a triangular wave in FIG. 3.

FIG. 3 is an equivalent circuit of the resolver. In this circuit, an exciting coil and an output coil are M-coupled with each other and relatively rotated (θ) to each other, and an input voltage Vi of the exciting coil and an output voltage Vo of the output coil are given by Equations (7) and (8) described below as shown in FIG. 4:

$$Vi = Ri \cdot Ii + SLi \cdot Ii + SM \cdot Io \qquad \text{Equation (7)}$$

$$Vo = Ro \cdot Io + SLo \cdot Io + SM \cdot Ii \qquad \text{Equation (8)}$$

Here, if the input impedance of the resolver signal input circuit is high, $Io \approx 0$ is satisfied, and Equations (7) and (8) are converted into the following equations:

$$Vi = Ri \cdot Ii + SLi \cdot Ii = (Ri + SLi)Ii \qquad \text{Equation (9)}$$

$$Vo = SM \cdot Ii \qquad \text{Equation (10)}$$

Note that Equation (10) means a release voltage and corresponds to an input current. The Laplace operator (S) is equivalent to jw in an electric circuit.

$$S \equiv jw$$

where

Vi: exciting (input) voltage
Ii: exciting (input) current
Vo: output voltage
Io: output current
Ri: DC resistance component of exciting coil
Ro: DC resistance component of output coil
Li: inductance component of exciting coil
Lo: inductance component of output coil
M: mutual inductance As in the above waveform, the rotating signals $\sin\theta \cdot f(t)$, $\cos\theta \cdot f(t)$ serving as resolver output signals (Vo) have rectangular waves. Since these rectangular waves are basically directly replaced with straight lines (DC) in synchronous detection of the following stage, a filter for converting a signal into a DC voltage in a conventional sin wave excitation is not required, thereby canceling a conventional filter time constant. As a result, the response characteristics of the control system can be improved.

An exciting component phase synchronizing method for a resolver will be described below.

Figure 5:
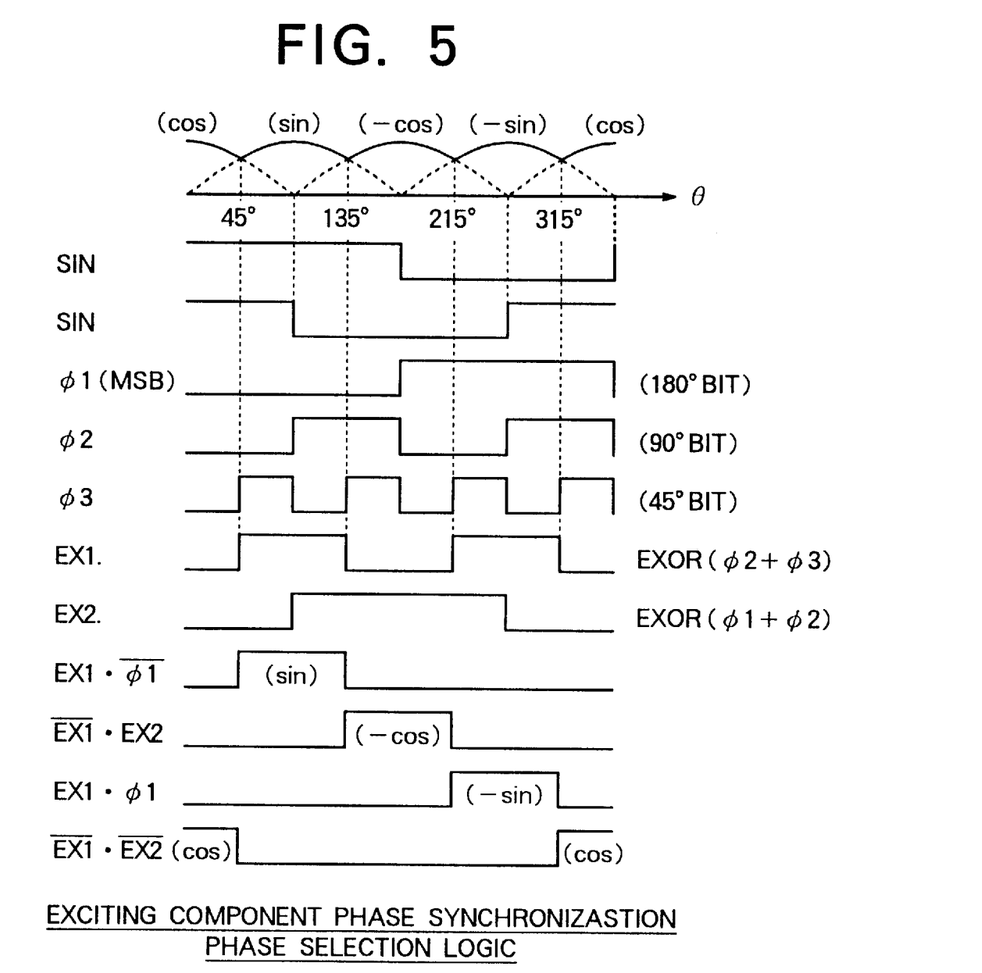
FIG. 5 is a waveform chart showing exciting component phase synchronization.

The exciting component f(t) of the rotating signals $\sin\theta \cdot f(t)$, $\cos\theta \cdot f(t)$ serving as resolver output signals is supplied from the current control amplifier 15 to the resolver 1 through a transfer cable, converted into a resolver output signal including angle information by the resolver 1, and then input to a reception-side circuit through the transfer cable again. In any one of these processes, a phase difference is generated.

In generation of the phase difference, when conversion efficiency is equivalently decreased when a signal is converted into a DC voltage in synchronous detection of the following stage, a loop gain of the control system decreases, and high-frequency noise is mixed, thereby adversely affecting the control characteristics. For this reason, according to the present invention, the following method is used. That is, attentions are given to only an exciting component (having a phase difference) included in a resolver signal, and the exciting component detected (extracted) from the resolver signal itself is replaced with an original exciting signal, so that a basic phase difference is always set to zero.

More specifically, as expressed by Equation (1), the resolver signal is subjected to amplitude modulation by the rotating angle θ. For this reason, depending on the angle, an amplitude level decreases, and the exciting component is inconveniently extracted.

Therefore, when 360° is divided by four into 90°, as shown in FIG. 4, a stable amplitude can be assured.

As preconditions in this case, an exciting component of a two-phase resolver signal must be free from a relative phase difference.

$$\sin\theta \cdot f(t) \longleftrightarrow \cos\theta \cdot f(t)$$

A triangular function approximate operation method will be described below.

Figure 6:
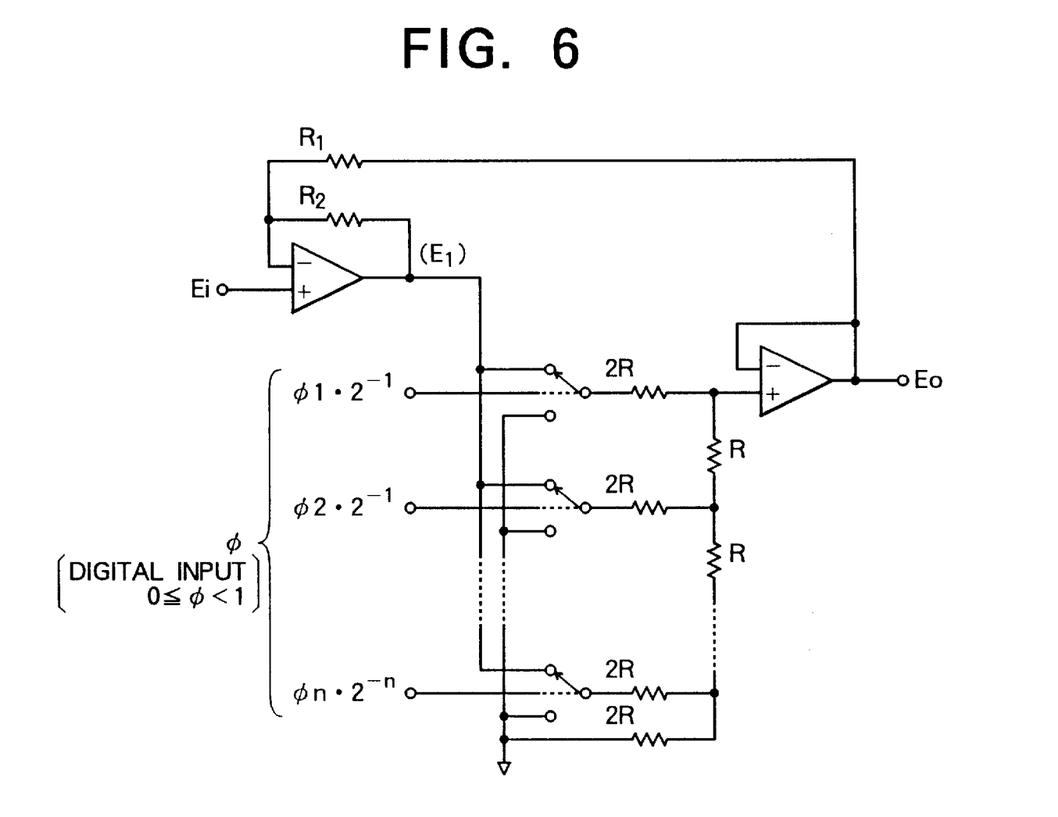
FIG. 6 is a circuit diagram used in a trigonometric function approximate operation.

In order to easily realize the sinφ and cosφ signals of the digital angle output φ required in the SIN·COS multiplier 2 by an electric circuit, the sinφ and cosφ signals are realized by approximate expressions shown in Equation (3):

[Number 3]

$$\sin\phi \approx \frac{(1+A) \cdot \phi}{1 + A \cdot \phi} \qquad \text{Equation (3)}$$

$$\cos\phi \approx \frac{(1+A)(1-\phi)}{1 + A \cdot (1-\phi)}$$

$$A \approx 0.56312$$

where $0 \leq \phi < 1$ (range of 0° to 90°).

In Equation (3), a value A is calculated by an experience manner, the approximate precision of this numerical value influences the digital conversion precision itself of the system.

The approximation of Equation (3) is to approximate a sin or cos function itself. The approximation is performed such that the function expressed by Equation (2), i.e., the value of the control deviation expressed by Equation (4) is maximally approximated.

An actual circuit for realizing Equation (3) is shown in FIG. 6. The basic arrangement of the circuit is a known multiplication type D/A converter, and selectively sets R1 and R2 of a feedback system to obtain the characteristics given by Equation (3).

Therefore, sinφ and cosφ in FIG. 6 are expressed by Equation (11) of Number 4:

[Number 4]

$$G = \frac{Eo}{Ei} = \frac{(R1+R2)\phi}{R1 + R2 \cdot \phi} = \frac{\left[1 + \frac{R2}{R1}\right]\phi}{1 + \frac{R2}{R1} \cdot \phi} \Rightarrow \sin\phi \qquad \text{Equation (11)}$$

With respect to cosφ, a complement $(=1-\phi)$ is input as φ.

$$A = R2/R1 \approx 0.56312$$

where A is put in Equation (3).

G is a transfer function of the circuit shown in FIG. 6, and approximates sinφ.

According to FIG. 6 and Equations (3) and (11), an arithmetic operation can be performed in the range of 0° to 90°. However, synthesis is performed such that one rotation is divided into four quadrants each having 90°, the entire range can be covered.

Figure 7:
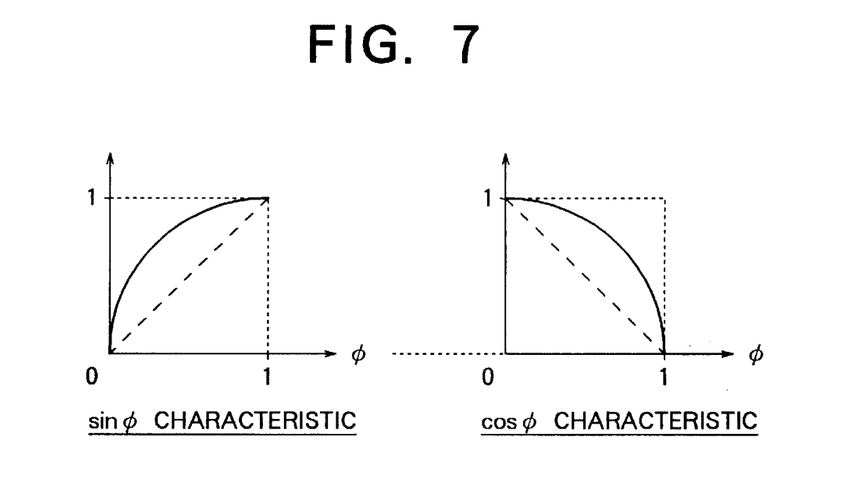
FIG. 7 is a graph showing sinφ and cosφ.
Figure 8:
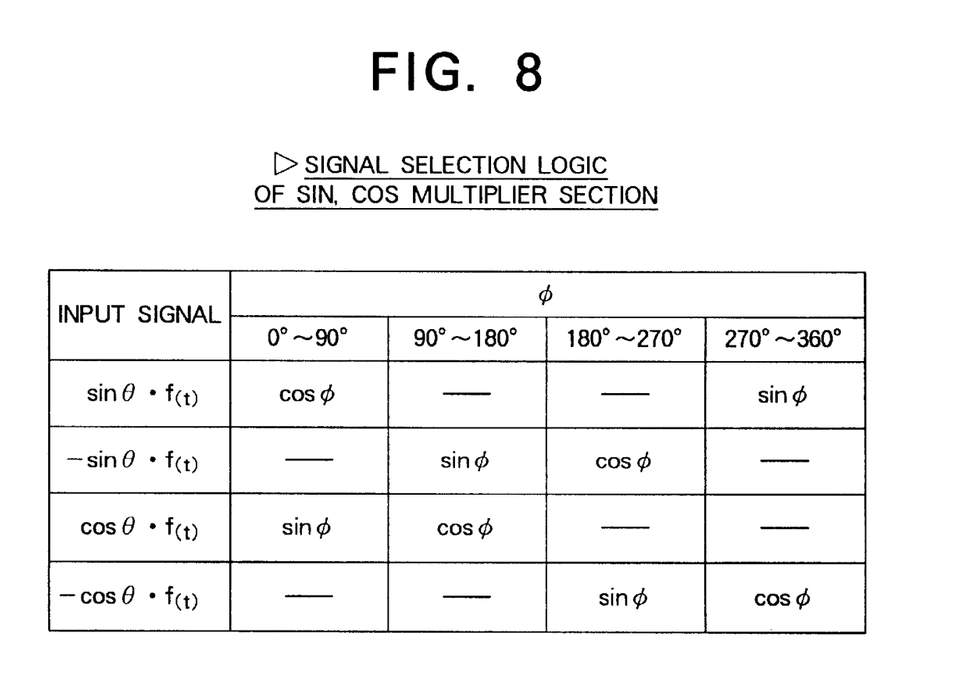
FIG. 8 is a table showing a signal selection logic of a sin·cos multiplier.

More specifically, as shown in FIG. 7, sinφ has monotonous increase characteristics, and cosφ has monotonous decrease characteristics, so that combinations shown in FIG. 8 can be realized.

Therefore, Equation (2) described above can be realized by the above combinations in the entire range.

$$\sin\theta \cdot f(t) \times \cos\phi - \cos\theta \cdot f(t) \times \sin\phi = \sin(\theta-\phi) \cdot f(t) \qquad \text{Equation (2)}$$

Figure 9:
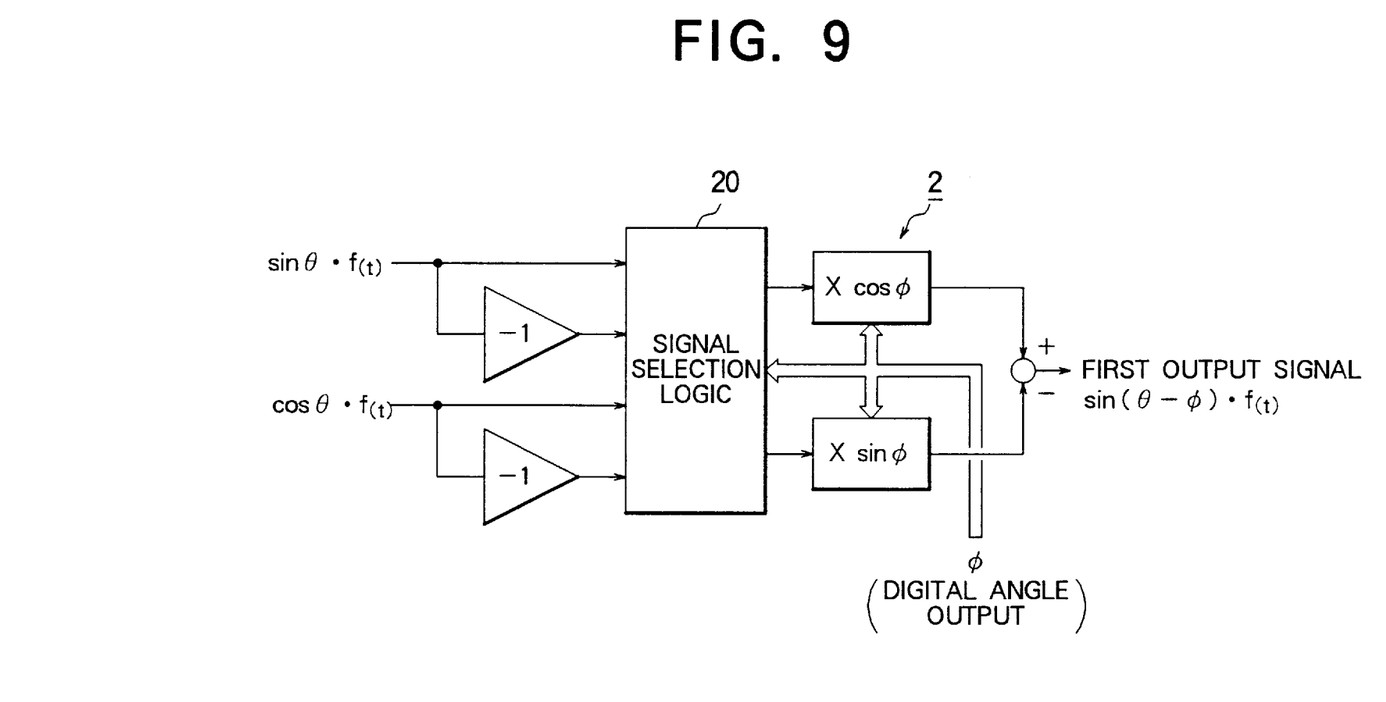
FIG. 9 is a block diagram showing an actual sin·cos multiplier section.

As an embodied block diagram of the SIN·COS multiplier 2, as shown in FIG. 9, the rotating signals sinθ·f(t), cosθ·f(t) are input to a signal selection logic 20 shown in FIG. 8 to perform a subtracting process to cosφ and sinφ, so that the first output signal sin(θ−φ)·f(t) can be output.

A multi-turn count detecting method will be described below.

Figure 10:
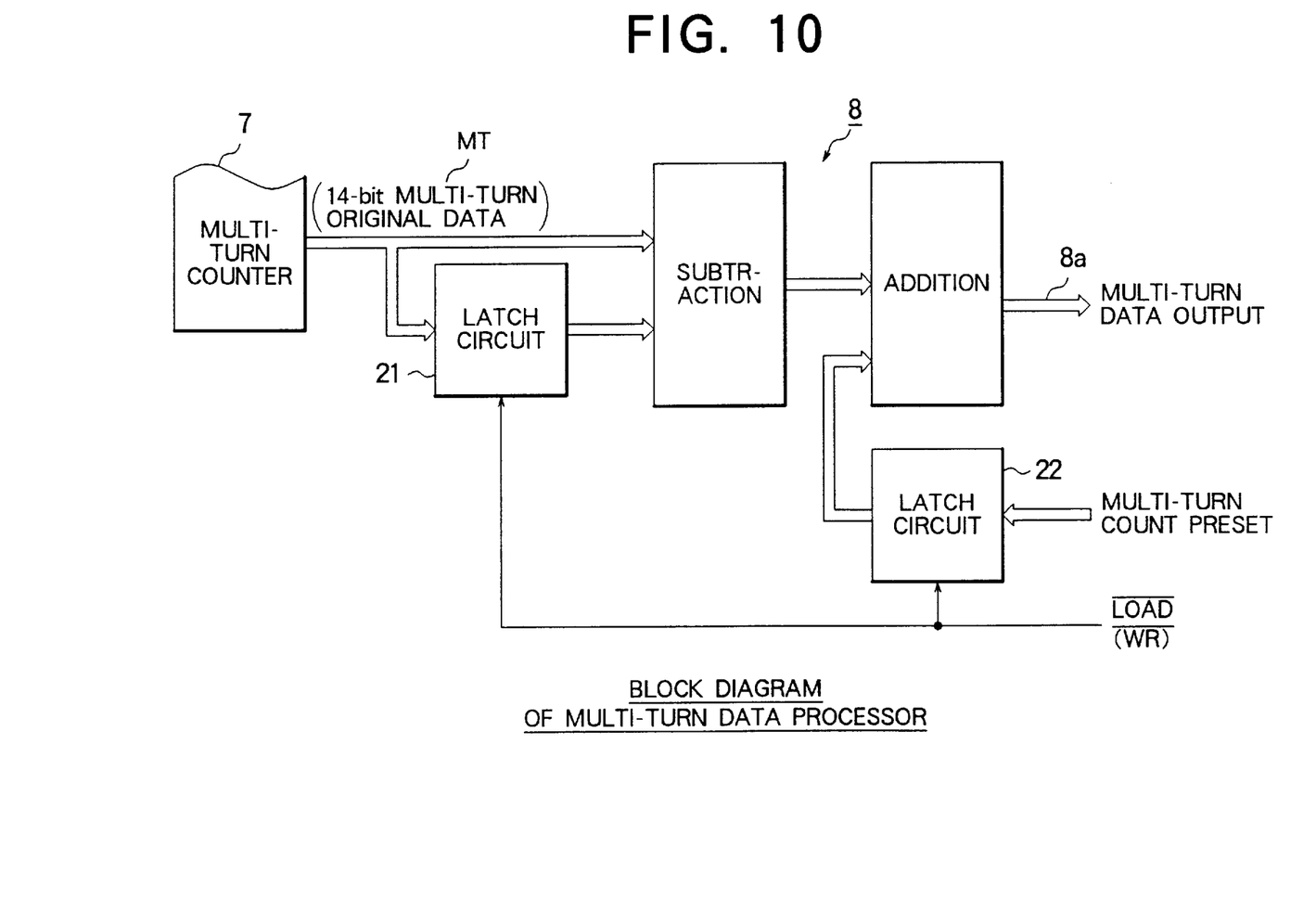
FIG. 10 is a block diagram showing a multi-turn data processor.

As shown in FIG. 10, when a carry signal (CA.) and a borrow signal (BO.) obtained by a one-turn (0° to 360°) counter 6 is introduced into the upper multi-turn counter 7, a multi-turn count is automatically realized. Note that a multi-turn count can be preset by using latch circuits 21 and 22.

The multi-turn detection value itself, as is apparent from the principle, although it is not an absolute value, a circuit shown in FIG. 10 is added as a means for realizing an absolute value (including a multi-turn portion) in only a continuous power ON state.

According to this circuit, a multi-turn count adjusted to a machine shaft is preset by the latch circuits 21 and 22 in a continuous power ON state. An absolute value detection can be equivalently realized in the entire range.

In a development of the above arrangement, in order to realize absolute value detection regardless of the ON/OFF state of the power supply, a precondition that the machine shaft does not move across a line of 0° in at least a power OFF state.

An operation of a voltage controlled oscillator (VCO) capable of generating an UP/DOWN pulse will be described below.

In a conventional tracking scheme, the VCO is a pulse oscillator depending on a single-polarity analog signal input level, and the polarity of UP/DOWN is determined by another circuit. The VCO according to the present invention has all the above functions to achieve the simplification, stability, and high speed of the circuit.

Figure 12:
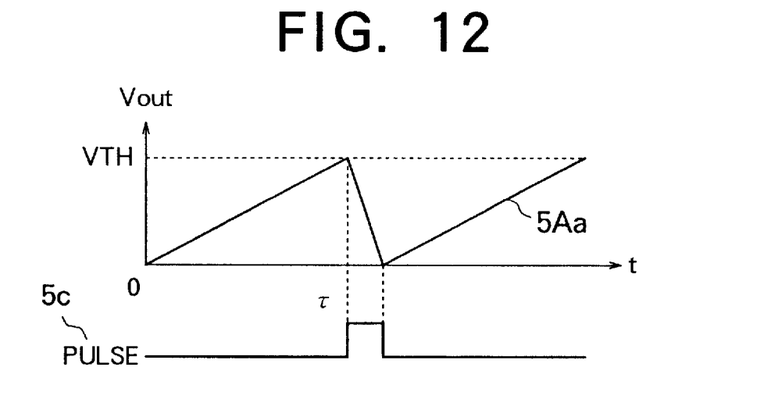
FIG. 12 is a waveform chart of the circuit in FIG. 11.

More specifically, when a pulse 5c is applied to a switch S connected between both the ends of a feedback capacitor C of a voltage controlled oscillator 5A in the basic arrangement shown in FIG. 10, and an pulse output 4a from the integrator 4 is input to $V_{in}$, an output $V_{out}$ constituted by a saw-tooth wave having a threshold $V_{TM}$ shown in FIG. 12 is obtained. When the output $V_{out}$ is equal to the threshold $V_{TH}$, charges accumulated in the feedback capacitor C are discharged by the pulse 5c to repeat a charging/discharging operation, thereby forming a saw-tooth wave. The output is constituted by $V_{TH}$ and an output frequency $f_0$ given by Equations (12) and (13) of Number 5:

[Number 5]

$$V_{TH} = \frac{1}{C}\int_0^t \left[\frac{V_{in}}{R}\right] dt = \frac{V_{in}}{CR} \cdot \tau \qquad \text{Equation (12)}$$

$$f_0 = \frac{1}{\tau} = \frac{Vi}{CR \cdot V_{TH}} \qquad \text{Equation (13)}$$

Figure 11:
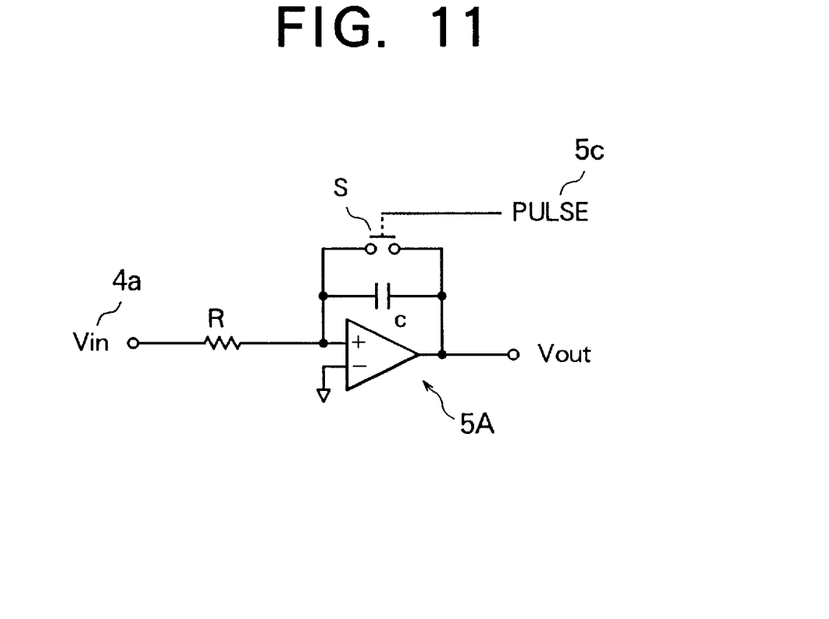
FIG. 11 is a circuit diagram showing a part of a voltage controlled oscillator.
Figure 13:
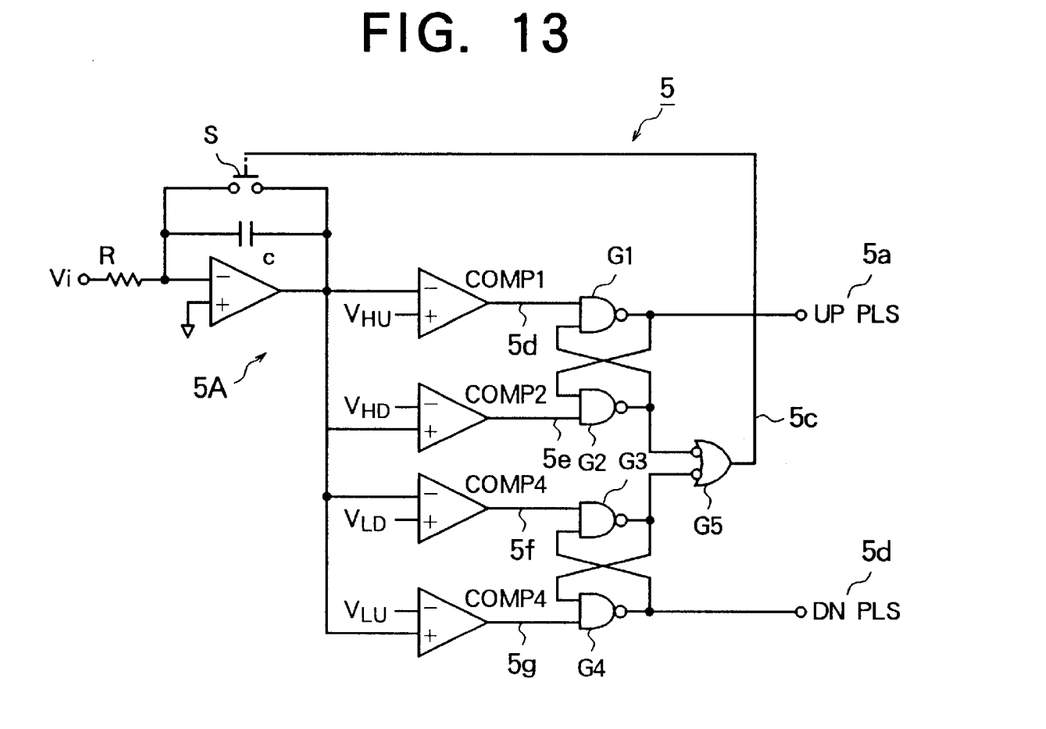
FIG. 13 is a circuit diagram showing the voltage controlled oscillator as a whole.

As shown in FIG. 13, the above voltage controlled oscillator 5 is arranged as follows. Four comparators COMP1 to COMP4 are arranged on the output side of the voltage controlled oscillator 5A as shown in FIG. 11, and four gate circuits G1 to G4 are arranged on outputs 5d, 5e, 5f, and 5g of the comparators COMP1 to COMP4 are arranged. The pulse 5c from a gate circuit G5 connected between the gates G2 and G3 is applied to the switch S connected between both the ends of the feedback capacitor C, and an up pulse 5a and a down pulse 5b are output from the gate G1 and the gate G4, respectively.

Figure 14:
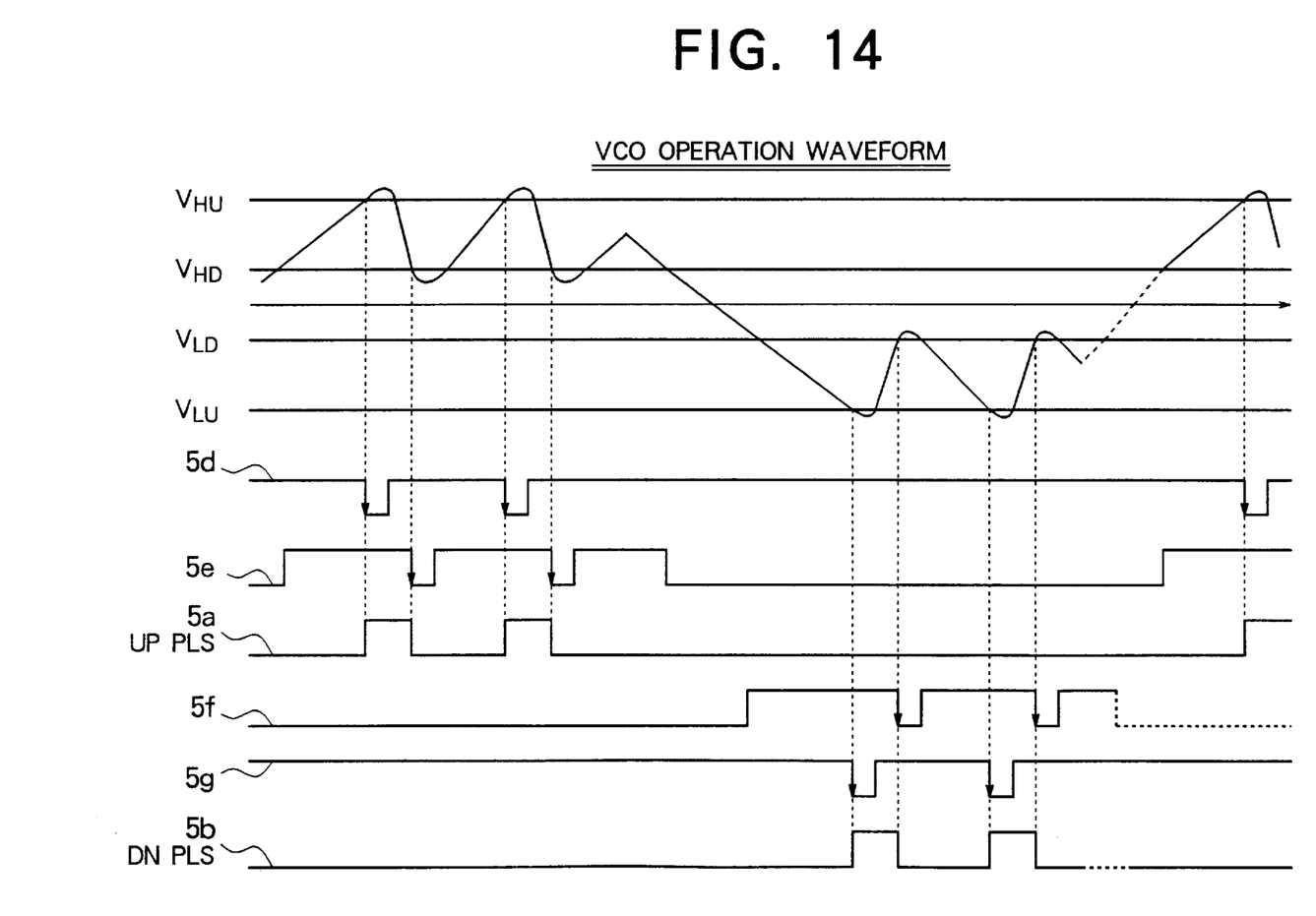
FIG. 14 is a waveform chart showing waveforms of respective sections in FIG. 13.

As the result of the experiment, stable oscillation up to about 2 MHz could be obtained. A waveform chart showing the operation in FIG. 13 is shown in FIG. 14.

In the resolver, as the signal state, modulation is performed by an exciting component f(t) included in the two-phase sin wave (sinθ, cosθ) as expressed in Equation (1).

Therefore, as a known sin wave encoder, even if a signal state which does not include an exciting component f(t) as expressed in Equation (14) is used, the signal state can be theoretically converted, and the application range of the signal state is increased.

$$\begin{aligned} E_1 &= K \cdot \sin\theta \\ E_2 &= K \cdot \cos\theta \end{aligned} \qquad \text{Equation (14)}$$

More specifically, as is apparent from Equation (14), when the exiting component f(t)=1 is satisfied, Equation (14) is equivalent to Equation (1). As a result, f(t)=1 is satisfied, i.e., control deviation ε can be obtained without synchronous detection. Therefore, the synchronous detection circuit may be simply fixed without being operated by turning off the synchronous detection ON/OFF signal 13a.

Since the digital angle conversion method according to the present invention is arranged as described above, the following advantages can be obtained. More specifically, a SIN·COS multiplier, a voltage controlled oscillator, a triangular wave oscillation circuit, and the like are made as a monolithic semiconductor, improvement of reliability and utility, a low price, and multi-function can be achieved. High-speed tracking can also be obtained.

What is claimed is:

1. A digital angle conversion method in which a digital angle output (φ) is obtained from a rotating signal (sinθ·f(t), cosφ·f(t), where f(t): an exciting component) obtained by a rotating detector (1), characterized in that the rotating signal (sinθ·f(t), cosφ·f(t)) is introduced into a sin·cos multiplier (2) and mutually operated with sinφ and cosφ obtained from the digital angle output (φ) to obtain a first output signal (sin(θ−φ)·f(t)) as the result of sinθ·f(t)×cosφ−cosθ·f(t)×sinφ=sin (θ−φ)·f(t), the first output signal (sin(θ−φ)·f(t)) is synchronously rectified by a synchronous detector (3) to remove the exciting component f(t) so as to obtain a second output signal (sin(θ−φ)), the second output signal (sin(θ−φ)) passes through an integrator (4) and a voltage controlled oscillator (5) to obtain the digital angle output (φ) from a one-turn counter, the digital angle output (φ) is input to said sin·cos multiplier (2) and a synchronous phase detector (11) to perform feedback control, control deviation ε=sin(θ−φ) in this feedback control is set to zero to satisfy θ=φ.

2. A digital angle conversion method according to claim 1, characterized in that a triangular wave obtained from a triangular wave oscillation circuit (14) is used as an exciting component f(t).

3. A digital angle conversion method according to claim 1 or 2, characterized in that the digital angle output (φ) is caused to pass through an encoder pulse generation logic section (12) to obtain encoder signals (A, B, Z, U, V, and W).

4. A digital angle conversion method according to claim 1 or 2, characterized in that an output from said one-turn counter (6) is input to a multi-turn counter to obtain multi-turn data (MT).

* * * * *